*INVENTORS*
KARL BRACK
EDWARD F. GOREY
GUENTHER H. SCHWUTTKE

BY Frank C. Leach Jr.

*ATTORNEY*

United States Patent Office 3,666,548

Patented May 30, 1972

3,666,548

MONOCRYSTALLINE SEMICONDUCTOR BODY HAVING DIELECTRICALLY ISOLATED REGIONS AND METHOD OF FORMING

Karl Brack, Fishkill, Edward F. Gorey, Beacon, and Guenther H. Schwuttke, Poughkeepsie, N.Y., assignors to International Business Machines Corporation, Armonk, N.Y.

Continuation-in-part of application Ser. No. 821,908, May 5, 1969. This application Jan. 6, 1970, Ser. No. 883

Int. Cl. H01l 7/00

U.S. Cl. 117—212 8 Claims

ABSTRACT OF THE DISCLOSURE

A monocrystalline semiconductor body has a single, continuous insulating layer extending from the surface to a selected depth in the body and surrounding a region of the body to dielectrically isolate the region, which has one surface formed by the surface of the body, from the remainder of the body. The insulating layer is produced by bombarding the body with ions, which react with atoms in the body when heated to a predetermined temperature. The ions are directed through an opening in a mask and a beveled surface of the mask surrounding the opening. The beveled surface controls the penetration of the ions from the surface of the body into the body to the sub-surface layer of the ions directed through the opening in the mask. When the body is heated to the selected temperature, the embedded ions react with the atoms in the body to produce the insulating layer and dielectrically isolate the region, which is surrounded by the single, continuous layer, from the remainder of the body.

This is a continuation-in-part of our copending patent application entitled "Semiconductor Isolation Structure and Method of Producing," Ser. No. 821,908, filed May 5, 1969 and assigned to the same assignee as the assignee of the present application.

In the fabrication of monolithic integrated circuits, a number of active elements such as transistors and diodes, for example, and a number of passive elements, such as resistors and capacitors, for example, are formed in or on the same monocrystalline semiconductor body. These active and passive elements are interconnected into a circuit by a pattern of metallization on an insulating film covering the surface of the semiconductor body. To prevent unwanted electrical interaction of the elements with each other, it is necessary to internally isolate the active and passive elements of the device from each other.

This electrical isolation from each other within the body has previously been formed by junction isolation or dielectric isolation. A junction isolation has the disadvantage of creating parasitic capacitance; this is particularly undesirable in high speed switching devices.

Another disadvantage of a junction isolation is that the junctions are sensitive to radiation. As a result, the exposure of the junction to significant amounts of radiation alters or breaks down the isolating junction to destroy the operability of the device. Therefore, a junction isolation is particularly undesirable in devices used by the military and devices employed in outer space.

The previous methods for forming dielectric isolation in a monocrystalline semiconductor body have been time consuming, tedious, very exacting, and expensive. One previously suggested method for dielectrically isolating elements of a monolithic integrated circuit device has been to etch channels in a semiconductor wafer to separate the various regions of the device. An insulating layer is then formed over the top surface of the device. Next, the device is inverted and the balance of the wafer removed down to the bottoms of the channels. This leaves segments of the wafer exposed with the insulation material surrounding the exposed segments and also functioning as a backing structure.

In our aforesaid application, there is disclosed a method of forming a sub-surface layer of insulating material to dielectrically isolate a portion of a device from the remainder of the devices in the body. The present invention is an improvement of our aforesaid application in that the present invention dielectrically isolates an entire device from the remainder of the body and accomplishes this in a single ion implantation step.

In the preferred form of the present invention, the penetration of the ions into the body is controlled by forming a mask with an opening having a beveled or inclined surface therearound. By directing the ions against the mask with a predetermined energy, ions will pass through the opening to a desired depth to form a sub-surface layer. Due to the beveled surface surrounding the opening, the ions will be implanted in the body from the periphery of the sub-surface layer upwardly to the surface of the body to completely surround an isolated region of the body to dielectrically isolate it from the remainder of the body.

An object of this invention is to provide a method for forming a dielectrically isolated region in a monocrystalline semiconductor body.

Another object of this invention is to provide a semiconductor device having a monocrystalline semiconductor body with at least one dielectrically isolated region therein.

The foregoing and other objects, features, and advantages of the invention will be more apparent from the following more particular description of the preferred embodiment of the invention as illustrated in the accompanying drawings.

Figure 1:
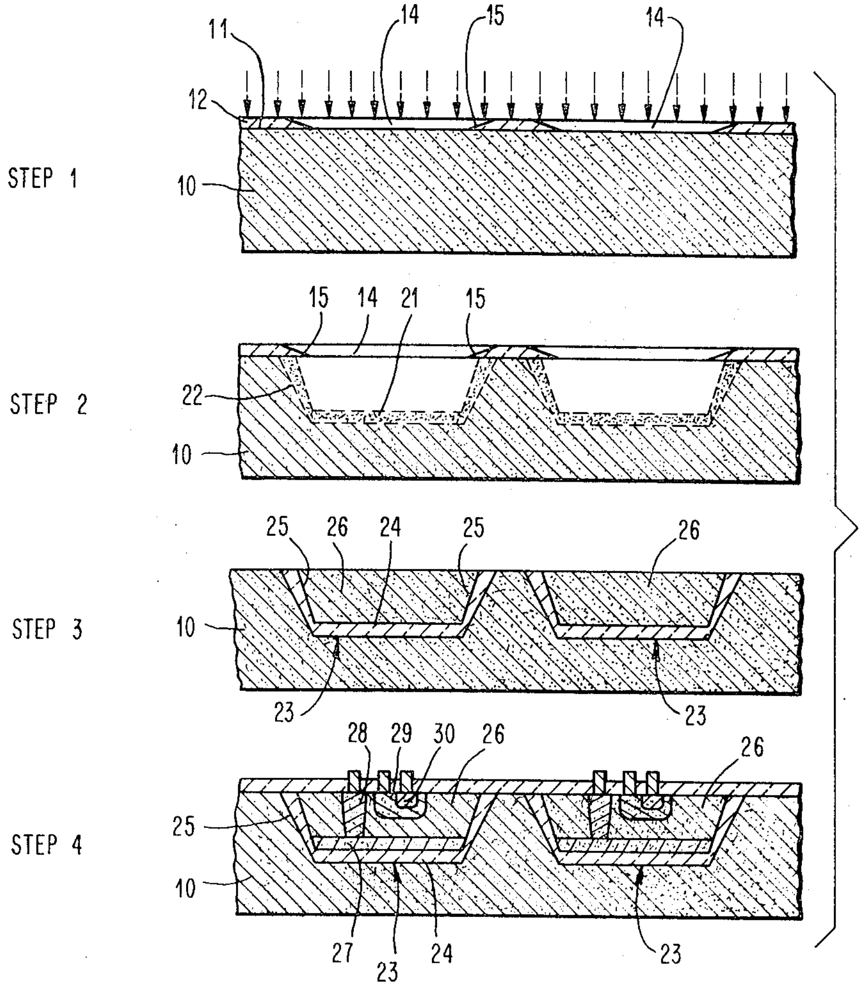
FIG. 1 is a flow diagram illustrating the process of the present invention for forming a layer of insulating material in a monocrystalline semiconductor body to dielectrically isolate a region in the body.

Referring to the drawings and particularly Step 1 of FIG. 1, there is shown a monocrystalline semiconductor body 10 formed of a suitable semiconductor material such as silicon, for example. The body 10 has its surface 11 masked by a mask 12, which may be formed of any suitable material that prevents ions from penetrating into the body 10 in the mask areas. For example, the material of the mask 12 may be gold, molybdenum, tungsten, silver, silicon dioxide, or silicon nitride.

When the mask is formed of gold or molybdenum, it preferably has a thickness of 3000 to 4000 A. At this thickness, the energy of the ions should be 2 mev.

As shown in Step 1 of FIG. 1, the mask 12 is formed with openings 14 therein through which ions may pass for implantation in the body 10. While only two of the openings 14 are shown in the mask 12, it should be understood that the mask 12 has a plurality of openings therein.

Each of the openings 14 is surrounded by a beveled or inclined surface 15 of the mask 12. The beveled or graded surface 15 is formed at an angle to the surface 11 of the body 10 to control the penetration of the ions into the body 10 in the region beneath the beveled surface 15.

As the angle of the beveled surface 15 to the surface 11 of the body 10 decreases, a larger region of ion implantation in the body 10 occurs. To produce the desired single, continuous insulating layer within the body 10 so as to dielectrically isolate a region of the body 10 from the remainder of the body, the angle of the beveled surface 15 with respect to the surface 11 of the body 10 should be no greater than 45°.

The ions are supplied from an ion source 16 (see FIG. 2) in which atoms of at least one element are ionized in the well-known manner. When the material of the body 10 is silicon, the elements are selected from a group consisting of oxygen, nitrogen, and carbon or a mixture thereof.

Figure 2:
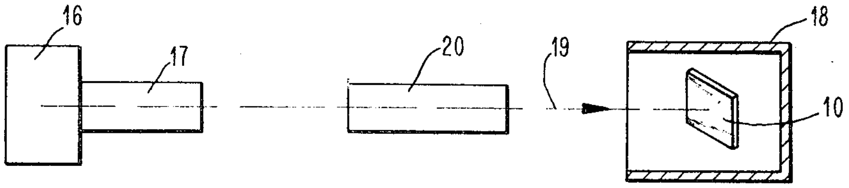
FIG. 2 is a diagrammatic view of an apparatus for ion implantation suitable for use in carrying out the method of the present invention.

The ions from the ion source 16 are accelerated by a potential gradient through an accelerator 17 to an energy high enough to be implanted in the body 10 when the body 10 is disposed within a target chamber 18 as shown in FIG. 2. Since the ion particles form a beam 19 that is charged, the beam 19 is deflected by magnets and electric fields. Accordingly, the beam 19 may be focused and deflected in a chamber 20, for example, for striking the body 10 in the target chamber 18.

The depth to which the ions of the beam 19 are implanted in the body 10 is a function of the energy of the ion beam 19, the angle of incidence of the beam 19 with respect to the body 10, the material of the mask 12, and the thickness of the mask 12. Generally, an ion beam with an energy of 5 kev. to 3 mev. is sufficient for implanting ions in the monocrystalline body 10. When the ions are directed against the surface of the mask 12, the ions penetrate to the greatest distance in the body 10 beneath the unmasked areas of the body 10. Accordingly, a sub-surface region 21 is formed directly beneath each of the openings 14 in the mask 12.

Within the region 21, there is a high concentration of implanted ions varying from $10^{18}$ to $10^{22}$ ions per cc. The depth of the region 21 within the body 10 depends upon the energy of the bombardment. In general, an energy of at least 1 mev. is utilized depending upon the depth of penetration desired, the material of the mask 12, and the thickness of the mask 12.

The beveled surface 15 of the mask 12 reduces the penetration of the ions into the body 10 to form a surrounding region 22 extending upwardly from the periphery of the region 21 to the surface 11 of the body 10 and at an angle to the region 21. Thus, the beveled surface 15 of the mask 12 provides an ion implantation in the body 10 that moves closer to the surface 11 of the body 10 as the thickness of the mask 12 increases. Accordingly, the energy of the ion beam 19 must be selected not only to produce the desired depth of the region 21 but also to insure that the region 22 extends from the region 21 to the surface 11 of the body 10. The region 22 has the same concentration of implanted ions as the region 21.

After the body 10 has been bombarded with the ions to form the sub-surface region 21 and the surrounding region 22, the mask 12 is removed from the body 10 in the well-known manner. Then, the body 10 is heated to a sufficient temperature such as 1100° C., for example, for a sufficient time to react the implanted ions with ions within the body 10. At a temperature of 1100° C., a time of at least one-half hour is usually required. The heating of the body 10 can be performed in the air, a vacuum, or an inert atmosphere such as nitrogen or argon, for example.

This heating of the body 10 results in the implanted ions, which are nitrogen, carbon, or oxygen when the body 10 is silicon, reacting with the silicon ions of the material of the body 10 to form an amorphous polycrystalline insulating layer 23. If the ions are formed from oxygen, the insulating layer 23 is silicon dioxide. If the ions are nitrogen, the insulating layer 23 is silicon nitride. If the ions are formed from carbons, the layer 23 is silicon carbide.

The layer 23 is a single continuous layer having a sub-surface portion 24 and a surrounding portion 25. Accordingly, the insulating layer 23 dielectrically isolates a region 26 of the body 10 from the remainder of the body 10. Thus, while the region 26 has the same monocrystalline structure as the remainder of the body 10, it is dielectrically isolated therefrom.

To obtain an effective and continuous layer, the concentration of the implanted ions from the ion source 16 must be larger than $10^{18}$ ions per cc. The preferred range of the concentration of the implanted ions is $10^{20}$ to $10^{23}$ ions per cc.

After the insulating layer 23 has been formed in the body 10 to dielectrically isolate the region 26, the body 10 can be processed to form an integrated semiconductor device within the region 26 as indicated in Step 4 of FIG. 1. Accordingly, a buried sub-collector region 27 can be produced in the region 26 by ion implantation, and a reach through region 28 made to establish a low resistance electrical contact.

A base region 29 and an emitter region 30 can be formed in the isolated region 26, which functions as the collector, in the body 10 by conventional diffusion techniques or by ion implantation techniques. The techniques useful for forming the various regions by ion implantation are adequately and completely disclosed in the copending and commonly assigned application, Ser. No. 750,650, filed Aug. 6, 1968.

Figure 3:
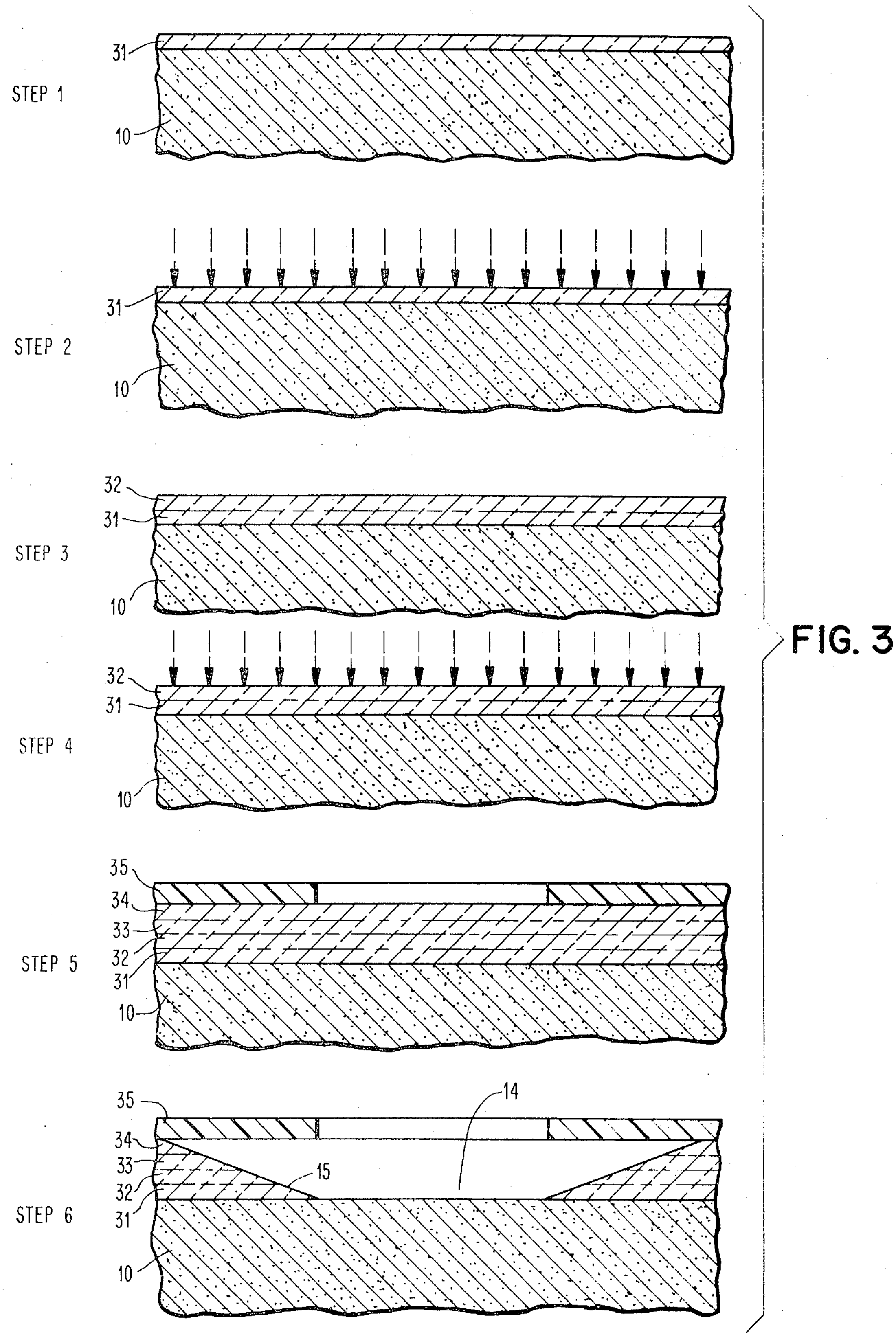
FIG. 3 is a flow diagram illustrating a process for forming an opening in a mask with a beveled or graded surface surrounding the opening.

One method of forming the beveled surface 15 around the opening 14 is shown in FIG. 3. In Step 1 of FIG. 3, the body or substrate 10 is shown as having a first layer 31 of the mask 12 deposited thereon. The layer 31 may be any of the materials previously set forth as suitable examples of the material of the mask 12 such as gold, molybdenum, tungsten, silver, silicon dioxide, or silicon nitride.

The metals may be deposited on the surface of the substrate 10 by sputtering or vapor deposition, for example. The silicon dioxide could be deposited on the substrate 10 by being thermally grown, pyrolytically deposited on, or sputtered, for example. The silicon nitride could be sputtered, for example, on the surface of the substrate 10.

After the layer 31, which may have a thickness of 500 A. to 1000 A., has been deposited on the surface of the substrate 10 as indicated in Step 1 of FIG. 3, the layer 31 is subjected to bombardment from ions as schematically indicated in Step 2 of FIG. 3. The ions may be any inert ions such as neon or argon, for example.

The bombardment energy level of the ions must be selected so that it is not so low that sputtering of the layer 31 will occur when ion bombardment occurs. Furthermore, the bombardment energy level of the ions must not be so high that the ions will penetrate into the substrate 10. Therefore, an energy level in the range of 50 kev. to 100 kev. is satisfactory.

After the layer 31 has been bombarded by the ions, another layer 32, which has a thickness of 500 A. to 1000 A., is deposited on the layer 31 in the same manner as the layer 31 was deposited on the substrate 10. The layer 32 is shown on the layer 31 in Step 3.

After the layer 32 has been formed, another ion bombardment occurs in Step 4. The energy level of the ion bombardment must again be above the level that would cause sputtering of the layer 32. However, the energy level must not be so high that the ions will penetrate into the layer 31. An energy level in the range of 50 kev. to 100 kev. is again satisfactory. However, the ion dose in Step 4 is at least twice the ion dose which was used in Step 2.

The process of deposition and ion bombardment may be repeated to form layers 33 and 34 whereby the mask 12 may comprise the four layers 31–34. The number of the layers, which form the mask 12, depends upon the thickness of the mask 12 and the thickness of each of the layers. The mask 12 preferably has a thickness of 4000 A. to 6000 A.

When the layer 33 is deposited, it is bombarded by ions having an ion dose at least twice as great as the ion dose used in bombarding the layer 32. Similarly, when the layer 34 is bombarded after deposition of the layer 34 following bombardment of the layer 33, it is subjected to ions having an ion dose at least twice as great as the ion dose of the ions that bombarded the layer 33. Thus, the ion dose for bombardment after formation of the new layer must be at least twice the ion dose in the prior bombardment.

In the ion bombardment after the layer 33 is deposited, the energy level must be such that it will not cause sputtering of the layer 33 or the ions to bombard the layer 32. The energy level of 50 kev. to 100 kev. is again satisfactory.

After the deposition of the layer 34, the energy level of the ion bombardment must not cause sputtering of the layer 34 or cause the ions to bombard the layer 33. The energy level of 50 kev. to 100 kev. is again satisfactory.

By controlling the ion dose, the etch rate for each of the layers 31–34 varies. Thus, the layer 34 has the highest etch rate while each of the other layers has a decreasing etch rate with the layer 31 having the lowest etch rate. This results in the mask 12 being formed with a controlled variable etch rate.

After completion of ion bombardment of the layer 34, a layer 35 of photoresist material is deposited on top of the layer 34 in the well-known manner to form a control mask. Openings are then formed in the layer 35 in the well-known manner wherever it is desired to have one of the openings 14 formed in the mask 12. When etching occurs, only the layer 31 will be etched with an opening of the same size as the opening 14 with all of the other layers etching at a greater amount to form the bevel or graded surface 15 around the opening 14.

Another method of forming the openings 14 in the mask 12 with the beveled surface 15 surrounding each of the openings 14 would be to form the mask 12 by pyrolytically depositing silicon dioxide on the surface of the substrate 10. The silicon dioxide would be doped with its dopant density being accurately controlled so that the etch rate is a controlled variable of the thickness of the silicon dioxide layer. The doping agent for the silicon dioxide could be boron or phosphorus, for example. With the mask 12 formed of a material having a controlled varying etch rate, the beveled surface 15 would be formed when forming the opening 14 in the mask 12 by a standard photolithographic technique, for example.

While the present invention has described the monocrystalline semiconductor body 10 as being formed of silicon, it should be understood that the body 10 could be formed of other monocrystalline semiconductor material such as gallium arsenide or germanium, for example. To produce the insulating layer 23 when the material of the body 10 is other than silicon, it would be necessary to implant silicon ions in the same general regions in the body 10 as the implanted nitrogen, oxygen, or carbon ions. This implantation of the silicon ions could be either done at the same time as the nitrogen, oxygen, or carbon ions by forming a mixture of the silicon ions with the nitrogen, oxygen, or carbon ions or before or after implantation of the nitrogen, oxygen, or carbon ions.

While the present invention has been shown and described as utilized for dielectrically isolating elements of monolithic integrated circuit devices, it should be understood that it has utility in other devices. For example, it could be used in photon wave guides and optical devices. It is only necessary that it be desired that the dielectrically isolated region be formed of the same crystal as the remainder of the body in which it is supported.

While the present invention has described the insulating layer from the sub-surface region to the surface of the body as being formed by utilizing a beveled surface around an opening in a mask, it should be understood that the control of the depth of the penetration of the ions to form this connecting layer could be by any other suitable means. For example, the bombardment energy of the ions could be controlled so that they would not be as high in regions surrounding the sub-surface region and continuously decrease in concentric and contiguous regions until the surface of the body is reached by the ions.

An advantage of this invention is that a single continuous insulating layer dielectrically isolates a region in a single monocrystalline semiconductor body from the remainder of the body. Another advantage of this invention is that it is less expensive for forming dielectric isolation of a region in a monocrystalline semiconductor body. A further advantage of this invention is that the problem of parasitic capacitance due to junction isolation is eliminated while still obtaining complete isolation of a region in the single monocrystalline semiconductor body.

While the invention has been particularly shown and described with reference to a preferred embodiment thereof, it will be understood by those skilled in the art that various changes in form and details may be made therein without departing from the spirit and scope of the invention.

What is claimed is:

1. A method of forming a dielectrically isolated region in a monocrystalline semiconductor body including:

bombaring the body with ions of at least one element that will react with ions within the body when heated to form an electrically insulating material, said element being selected from the group consisting of nitrogen, oxygen and carbon;

controlling the bombardment of the body by the ions of the element so that the penetration of the ions of the element into the body implants ions of the element from the surface of the body to the desired depth within the body to completely separate from the remainder of the body a region of the body by the implanted ion of the element within the body, the control of the penetration of the ions being obtained by disposing a mask of sufficient thickness over the surface of the body between the ion source and body, to resist penetration of the ions with the mask having openings with a beveled surface around each opening in the mask, the angle of the beveled surface with respect to the surface of the body being no greater than 45 degrees;

maintaining the bombardment for a time suffcient to produce an ion concentration of at least $10^{18}$ ions per cc. at an energy level sufficient to result in ion penetration through each opening in the mask to a desired depth within the body and through the beveled surface to implant ions in the body from the desired depth to the surface of the body;

and heating the bombarded body to a temperature sufficient to react the ions of the element introduced by the bombardment with the ions within the body.

2. The method according to claim 1 in which:

the material of the body is silicon;

and the ions of the element react with the ions of the silicon when the bombarded body is heated.

3. The method according to claim 1 in which the energy of bombardment is at least 1 mev.

4. A method of forming a dielectrically isolated region in a monocrystalline silicon semiconductor body including the steps of:

bombarding the body with ions of at least one element selected from the group consisting of nitrogen, oxygen and carbon;

controlling the penetration of the ions of the element into the body by disposing a mask of sufficient thickness over the surface of the body to resist penetration of the ions and with the mask having openings with a beveled surface around each opening in the mask between the ion source and the body, the angle of the beveled surface with respect to the surface of the body being no greater than 45°;

maintaining the bombardment of the mask at an energy level sufficient to cause the ions to pass through each opening in the mask and through the beveled surface to implant ions in the body from a desired depth to the surface of the body for a time sufficient to produce an ion concentration of at least $10^{18}$ ions per cc.;

and heating the bombarded body to a temperature sufficient to react the ions of the element introduced by the bombardment with the ions within the body to form single continuous layers of insulating material extending from said surface of said body into said body to form dielectrically isolated regions in said body.

5. The method of claim 4 in which the ion concentration is from about $10^{20}$ to $10^{22}$ ions per cc.

6. The method of claim 4 wherein the mask is formed on the body with a controlled varying etch rate that decreases from the surface of the mask to the surface of the substrate;

forming the openings in the mask by etching the mask from the surface of the mask to the surface of the substrate with an etchant through openings in a control mask disposed over the mask;

and continuing etching of the mask until the openings are completed through the thickness of the mask to the substrate so that a larger amount of the material of the mask is removed in an increasing rate from the surface of the substrate to the surface of the mask to form the beveled surface around the openings.

7. The method according to claim 6 including:

depositing a plurality of layers of the material in separate steps to form the mask;

bombarding the material after deposition with ions of an inert element with the ions having an energy level of 50 kev. to 100 kev.;

and increasing the ion dose of each bombardment so that the ion dose is at least twice the ion dose of the bombardment of the prior layer.

8. The method according to claim 7 in which the ions of the inert element are selected from the group of inert elements consisting of argon and neon.

References Cited

UNITED STATES PATENTS

| | | | |
|---|---|---|---|
| 3,469,147 | 9/1969 | Benzing | 317—235 X |
| 3,401,450 | 9/1968 | Godejohn, Jr. | 317—235 X |
| 3,391,023 | 7/1968 | Frescura | 117—212 |
| 3,515,956 | 2/1970 | Martin et al. | 317—234 |
| 3,457,632 | 7/1969 | Dolan, Jr. et al. | 148—1.5 X |
| 2,666,814 | 1/1954 | Shockley | 317—235 X |
| 3,451,867 | 6/1969 | Taft, Jr. et al. | 317—235 X |

RALPH S. KENDALL, Primary Examiner

U.S. Cl. X.R.

117—93.3; 156—7